United States Patent
Liu (10) Patent No.: US 7,409,490 B2
(45) Date of Patent: Aug. 5, 2008

(54) METHOD OF FLASH MEMORY MANAGEMENT

(76) Inventor: Yi-Chun Liu, 6F., No. 68, Beida Rd., Hsinchu City 300 (TW)

( * ) Notice: Subject to any disclaimer, the term of this patent is extended or adjusted under 35 U.S.C. 154(b) by 167 days.

(21) Appl. No.: 11/279,889

(22) Filed: Apr. 15, 2006

(65) Prior Publication Data

US 2007/0245064 A1     Oct. 18, 2007

(51) Int. Cl.
*G06F 12/00* (2006.01)
(52) U.S. Cl. ........................ 711/103; 711/206
(58) Field of Classification Search ............ None
See application file for complete search history.

(56) References Cited

U.S. PATENT DOCUMENTS 6,285,592 B1 * 9/2001 Kubota .............. 365/185.22
2005/0055495 A1   3/2005 Vihmalo et al. .......... 711/103
2005/0073884 A1   4/2005 Gonzalez et al. .......... 365/185

* cited by examiner

*Primary Examiner*—Reginald G. Bragdon
*Assistant Examiner*—Ngoc V Dinh (57) ABSTRACT

A wear-leveling method for managing flash memory is provided, including an access process to consult a translation table when accessing a data block in the data region, and a reconstruction process to reconstruct the translation table when powering on the flash memory. The translation table is defined to include a plurality of entries, and each entry includes a physical address field and an enduring counter field. The logical address of a data block is used as input to map to the entry in the translation table. The access process, further including a read process and an erase/program process, maps the logical address to the physical address, and uses the enduring counter to determine whether an update is required to avoid the disturbance. The reconstruct process uses the information stored in the spare data region to reconstruct the translation table for the access process to consult during flash memory accesses.

4 Claims, 10 Drawing Sheets

| Data region | Spare region | |
|---|---|---|
| User data | Logical address | ECC code |

| Data region | Spare region | | |
|---|---|---|---|
| User data | Logical address | Enduring counter | ECC code |

| | PA | EC |
|---|---|---|
| 0 | 3 | 9 |
| 1 | 7 | 6 |
| 2 | 4 | 22 |
| 3 | 0 | 17 |
| 4 | 5 | 15 |
| 5 | 1 | 10 |
| 6 | 6 | n/a |
| 7 | 2 | n/a |

Logical address 5 → 5

Physical address: 1
Enduring counter: 10

| Physical block address | Logical address | Enduring counter (8bit) |
|---|---|---|
| 0 | 3 | 9 |
| 1 | 5 | 7 |
| 2 | Unused | n/a |
| 3 | 0 | 15 |
| 4 | 2 | 19 |
| 5 | 4 | 18 |
| 6 | Unused | n/a |
| 7 | 1 | 16 |

| Physical block address | Logical address | Enduring counter (8bit) |
|---|---|---|
| 0 | 3 | 255 |
| 1 | 5 | 5 |
| 2 | Unused | n/a |
| 3 | 0 | 249 |
| 4 | 2 | 3 |
| 5 | 4 | 1 |
| 6 | Unused | n/a |
| 7 | 1 | 252 |

|   | PA | EC |
|---|----|----|
| 0 | 3  | 9  |
| 1 | 7  | 6  |
| 2 | 4  | 22 |
| 3 | 0  | 17 |
| 4 | 5  | 15 |
| 5 | 1  | 10 |
| 6 | 6  | n/a |
| 7 | 2  | n/a |

Logical address 5 → 5

Physical address: 1
Enduring counter: 10

|   | PA | EC |
|---|----|----|
| 0 | 3  | 9  |
| 1 | 2  | 24 |
| 2 | 4  | 22 |
| 3 | 0  | 17 |
| 4 | 5  | 15 |
| 5 | 6  | 23 |
| 6 | 1  | n/a |
| 7 | 7  | n/a |

FIG. 12B ic camera, flash memory stick, mobile phones, PDA, and so on. NAND flash memory is usually structured with 16 neighboring cells serially connected without any contact area in-between to offer high density. Electron tunneling is used for erase/program, i.e., write, operations for low power consumption. NAND flash memory shows promising performance in write-intensive applications that demand faster writing time.

METHOD OF FLASH MEMORY MANAGEMENT

FIELD OF THE INVENTION

The present invention generally relates to a method of flash memory management, and more specifically to a method for managing flash memory to improve the wear-leveling effectiveness.

BACKGROUND OF THE INVENTION

Flash memory, especially NAND flash memory, is used in a wide range of electronic products, such as MP3 players, digital camera, flash memory stick, mobile phones, PDA, and so on. NAND flash memory is usually structured with 16 neighboring cells serially connected without any contact area in-between to offer high density. Electron tunneling is used for erase/program, i.e., write, operations for low power consumption. NAND flash memory shows promising performance in write-intensive applications that demand faster writing time.

Figure 1:
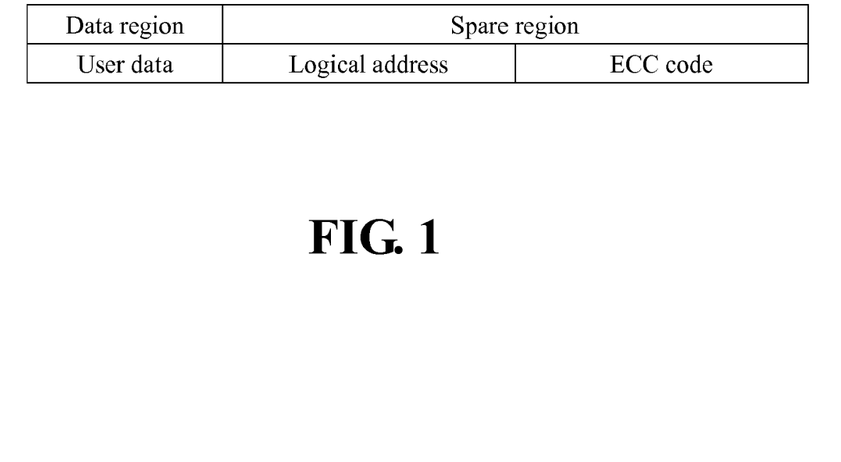
FIG. 1 shows a schematic view of the configuration of a flash memory.

Conventional flash memory is configured as a data region and a spare region. The data region is for storing data, and is usually divided into data blocks, or simply blocks. The spare region is for storing additional information on the usage of the data region. FIG. 1 shows a schematic view of the configuration of a flash memory. As shown in FIG. 1, the spare region contains information such as logical address and the error correction code (ECC) of each flash memory block.

Figure 2:
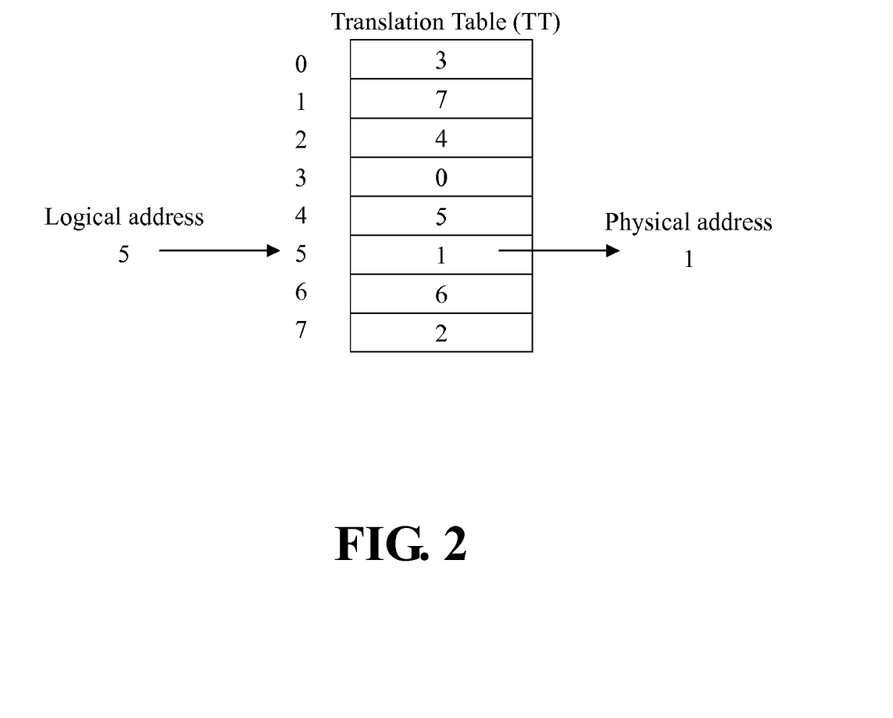
FIG. 2 shows a schematic view of a translation table reconstructed from the information in the spare region of FIG. 1.

The flash memory management mechanism usually utilizes a translation table. The translation table records the mapping of a logical block address (LBA) to a physical address. When flash memory is powered on, the flash memory management mechanism includes the reconstruction of the translation table, and the translation table is then used for finding the physical address of the read and erase/program operations. FIG. 2 shows a schematic view of a translation table reconstructed from the information in the spare region of FIG. 1. This management mechanism provides good data access efficiency because the mapping of an LBA to a physical address can be easily found in the translation table.

However, a potential problem may occur if the application repetitively writes (erase/program) into the same logical block. This problem, commonly known as disturbance, is caused by the generation of oxide charges during the erase/program operation in flash memory. As the erase/program operation is accomplished by the tunneling algorithm using high voltage of about 20V, which leads to the degradation of the tunnel oxide quality and a failure if it is repeated without the limit. The limit is commonly referred to as endurance. When the number of erase/program operations exceeds the endurance, the un-updated data will be disturbed, i.e., ruined, and lost. Although not all the applications would exceed the endurance, flash memory designers should always bear in mind the existence of the endurance limit.

Figure 3:
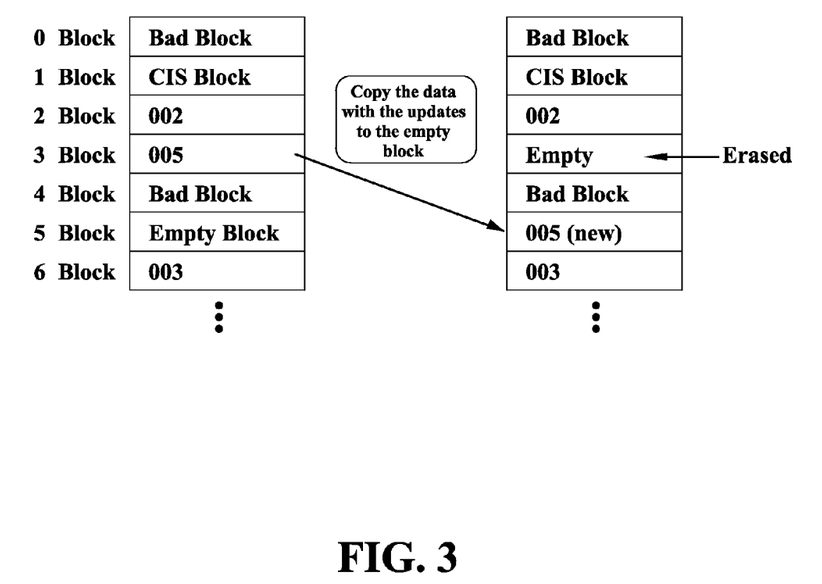
FIG. 3 shows a schematic view of a wear-leveling algorithm which is applied in the erase/program operation.

Many approaches have been developed to alleviate or postpone the disturbance effect. For example, a wear-leveling algorithm can be used to spread the erase/program operations evenly across all the blocks of the flash memory to avoid some of the blocks prematurely reaching the endurance. FIG. 3 shows a schematic view of a wear-leveling algorithm which is applied in the erase/program operation. As shown in FIG. 3, when an updated data is written into a block, the content of the block (with the updates) is copied to an empty block, and the original block is marked as erased. In other words, when an erase/program operation is executed, a different block is used to prevent repetitive wearing of the same data block. Therefore, wear-leveling algorithms prolong the life span of the flash memory.

U.S. Patent Application Publication US 2005/0073884 A1 disclosed a flash memory data correction and scrub technique to maintain the data integrity of flash memory that is susceptible to disturbance caused by operations in adjacent regions of the memory. U.S. Patent Application Publication No. US 2005/0055495 A1 disclosed a method for reducing wearing of memory hotspots by rotating the memory blocks on the physical level. However, the extent to which the wear-leveling algorithm can achieve remains the most important criterion.

SUMMARY OF THE INVENTION

The present invention has been made to overcome the above-mentioned drawback of the disturbance problem in flash memory. The primary object of the present invention is to provide a wear-leveling method for managing flash memory. By using a translation table having a field of an enduring counter, the method of the present invention is able to maintain the even spread of the erase/program operations over the entire flash memory data region to postpone the disturbance.

Another object of the present invention is to provide an efficient wear-leveling method for managing flash memory by only updating a data block when the enduring counter of that data block is close to the endurance limit. By updating only one data block at a time, the method of the present invention is able to maintain the access time within a smaller deviation.

To achieve the above objects, the present invention provides a wear-leveling method for managing flash memory, including an access process to consult a translation table when accessing a data block in the data region, and a reconstruction process to reconstruct the translation table when powering on the flash memory. The translation table is defined to include a plurality of entries, and each entry includes a physical address field and an enduring counter field. The logical address of a data block is used as input to map to the entry in the translation table. The access process, further including a read process and an erase/program process, maps the logical address to the physical address, and uses the enduring counter to determine whether an update is required to avoid the disturbance. The reconstruct process uses the information stored in the spare data region to reconstruct the translation table for the access process to consult during flash memory accesses.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 4:
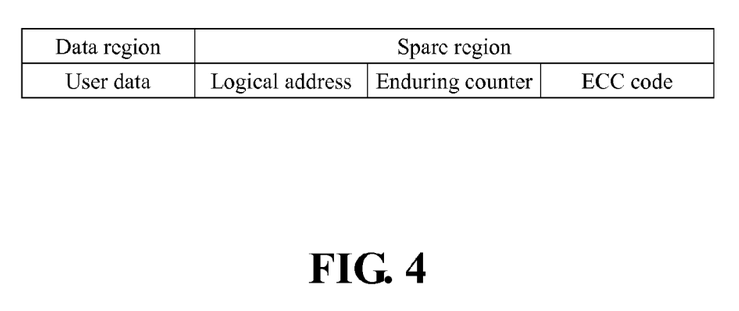
FIG. 4 shows a schematic view of the configuration of the flash memory in accordance with the method of the present invention.

FIG. 4 shows a schematic view of the configuration of the flash memory in accordance with the method of the present invention, including a data region for storing user data and a spare region for storing extra information on the flash memory. As shown in FIG. 4, the spare region includes a logical address field, an enduring counter field, and an ECC code field.

Figure 5:
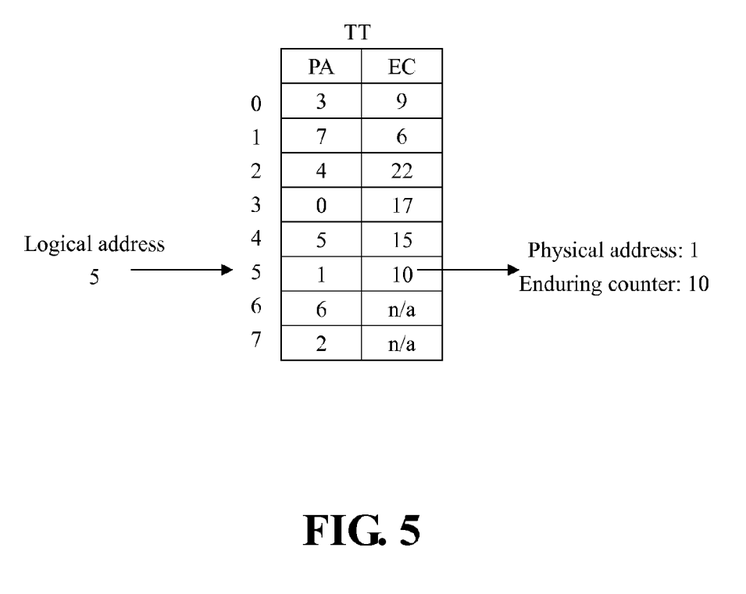
FIG. 5 shows a schematic view of the translation table in accordance with the method of the present invention.

FIG. 5 shows a schematic view of the translation table in accordance with the method of the present invention. As shown in FIG. 5, the translation table includes a plurality of entries, and each entry includes a physical address field and an enduring counter field. The number of the entries in the translation table is set to be twice of the number of the data blocks; that is, if there are n data blocks, the translation table will contain 2*n entries.

Figure 6:
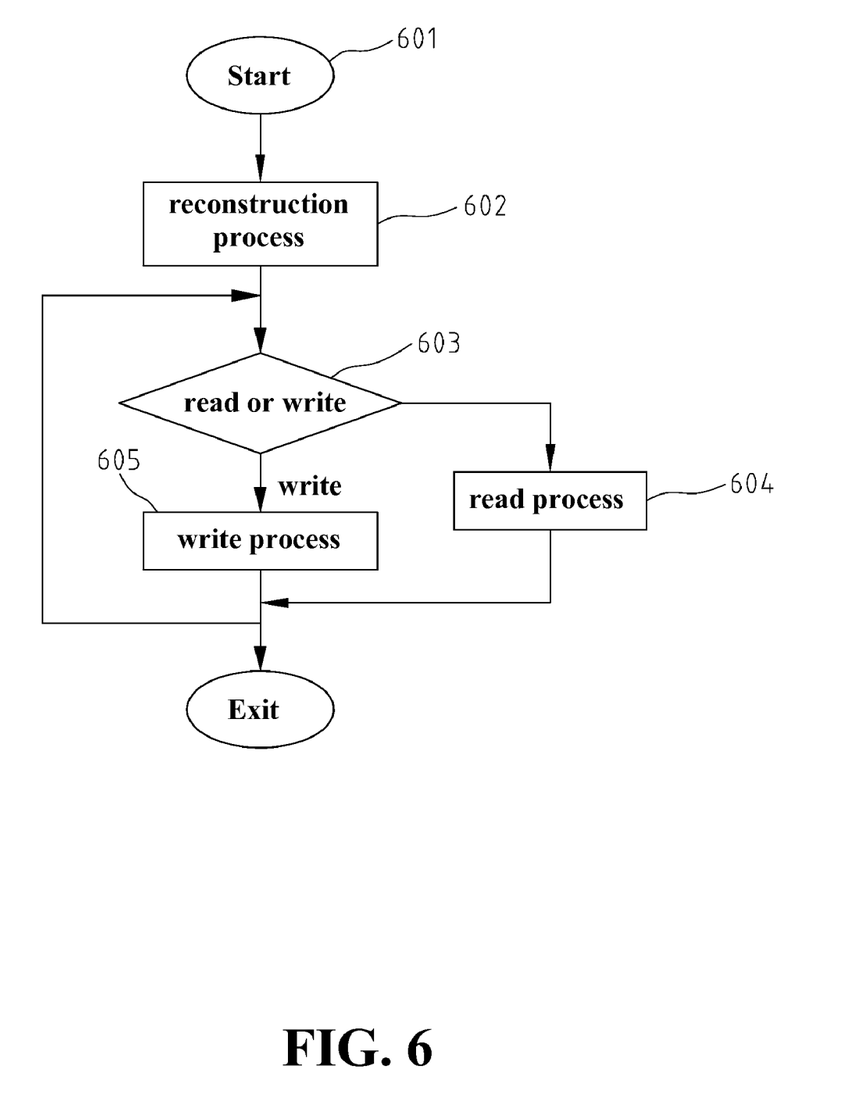
FIG. 6 shows a flowchart of a wear-leveling method for managing flash memory of the present invention.

FIG. 6 shows a flowchart of a wear-leveling method for managing flash memory. The method starts with step 601. Step 602 is the reconstruction process, which is to reconstruct the translation table when the flash memory is powered on. After the translation is constructed, step 603 is to determine whether the operation accesses the flash memory is a read operation or a write (erase/program) operation. If it is a read access, proceed to step 604 for the read process; otherwise, proceed to step 605 for the erase/program process. Steps 603, 604, 605 form an iterative loop, and the method exits the loop until the flash memory is no longer in use, e.g., powered off.

The method of the present invention also maintains the following variables:

n is the number of the data blocks in an access region;

p is the logical address space, and n>p;

q is a pointer pointing to an unused block;

m is the maximum of the difference of erase/program operations between the blocks allowable within the access region;

x is the number of bits in the enduring counter field in the translation table, and $2^x > 2 \times (m+n)$, $m > 2 \times n$;

BaseEC is the minimum enduring counter value within an access region;

MaxEC is the maximum enduring counter value within an access region;

Reverse is a Boolean variable indicating the condition of EC usage.

The present invention uses a fixed number of bits, i.e., x, to represent the enduring counter. To avoid overflow, the present invention uses a round-robin manner to keep the values of all the enduring counters. When the range of the values crosses the boundary of $2^x-1$, the Boolean variable Reverse is set to be true. That is, when Reverse is true, the condition BaseEC>MaxEC holds.

Figure 7:
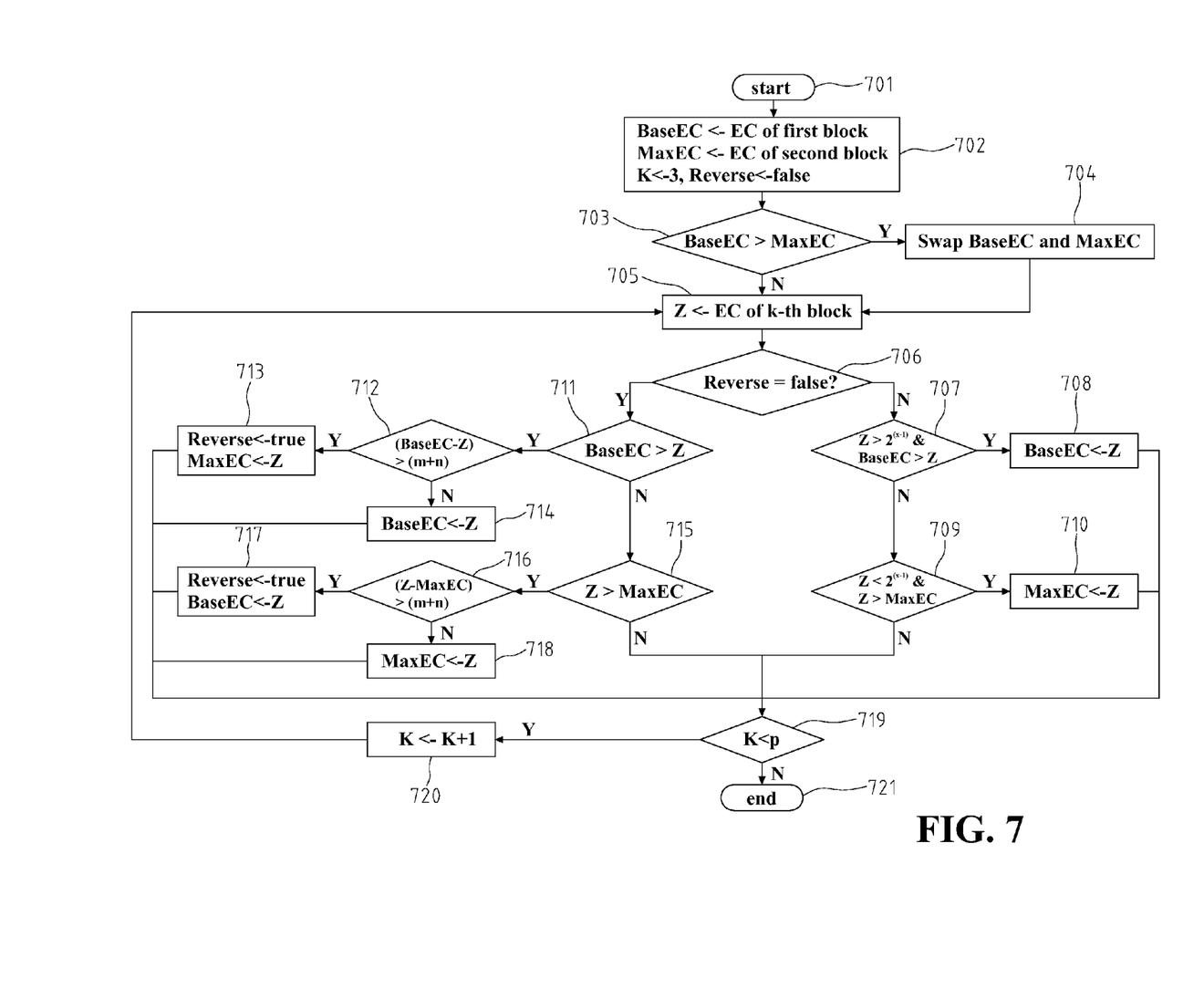
FIG. 7 shows a flowchart of the reconstruction process of FIG. 6.

FIG. 7 shows a flowchart of the reconstruction process of step 602 of FIG. 6. The reconstruction process starts with step 701. Step 702 is to initialize variables, including setting BaseEC equal to the EC of the first block of the access region, MaxEC equal to the EC of the second block, and Reverse equal to false. An iteration variable k is used to keep track of the k-th block. Step 703 is to determine the condition BaseEC>MaxEC; if true, swap BaseEC and MaxEC (step 704). Step 705 is to set a temporary variable Z equal to the EC of the k-th block. Another temporary variable K is to keep track of the EC of the k-th block, which is currently in reconstruction iteration. Step 706 is to determine whether Reverse is false; if not, proceed to step 707; otherwise, proceed to step 711. Step 707 is to further determine whether $Z>2^{(x-1)} \wedge BaseEC>Z$; if so, proceed to step 708 to set BaseEC equal to Z; otherwise, proceed to step 709. Step 709 is to determine whether $Z<2^{(x-1)} \wedge MaxEC<Z$; if so, proceed to step 710 to set MaxEC equal to Z; otherwise, proceed to step 719. Step 719 is to determine whether all the blocks are processed for the reconstruction; if so, proceed to step 721 to exit; otherwise, proceed to step 720 to increment iteration variable k, and then return to step 705 for another iteration.

Step 711 is to determine whether BaseEC>Z; if so, proceed to step 712; otherwise proceed to step 715. Step 712 is to further determine whether (BaseEC−Z)>(m+n); if so, proceed to step 713 to set Reverse equal to true and MaxEC equal to Z; otherwise, proceed to step 714 to set BaseEC equal to Z. Then proceed to step 719.

Step 715 is to determine whether MaxEC<Z; if so, proceed to step 716; otherwise proceed to step 719. Step 716 is to further determine whether (Z−BaseEC)>(m+n); if so, proceed to step 717 to set Reverse equal to true and BaseEC equal to Z; otherwise, proceed to step 718 to set MaxEC equal to Z. Then proceed to step 719.

Figure 8:
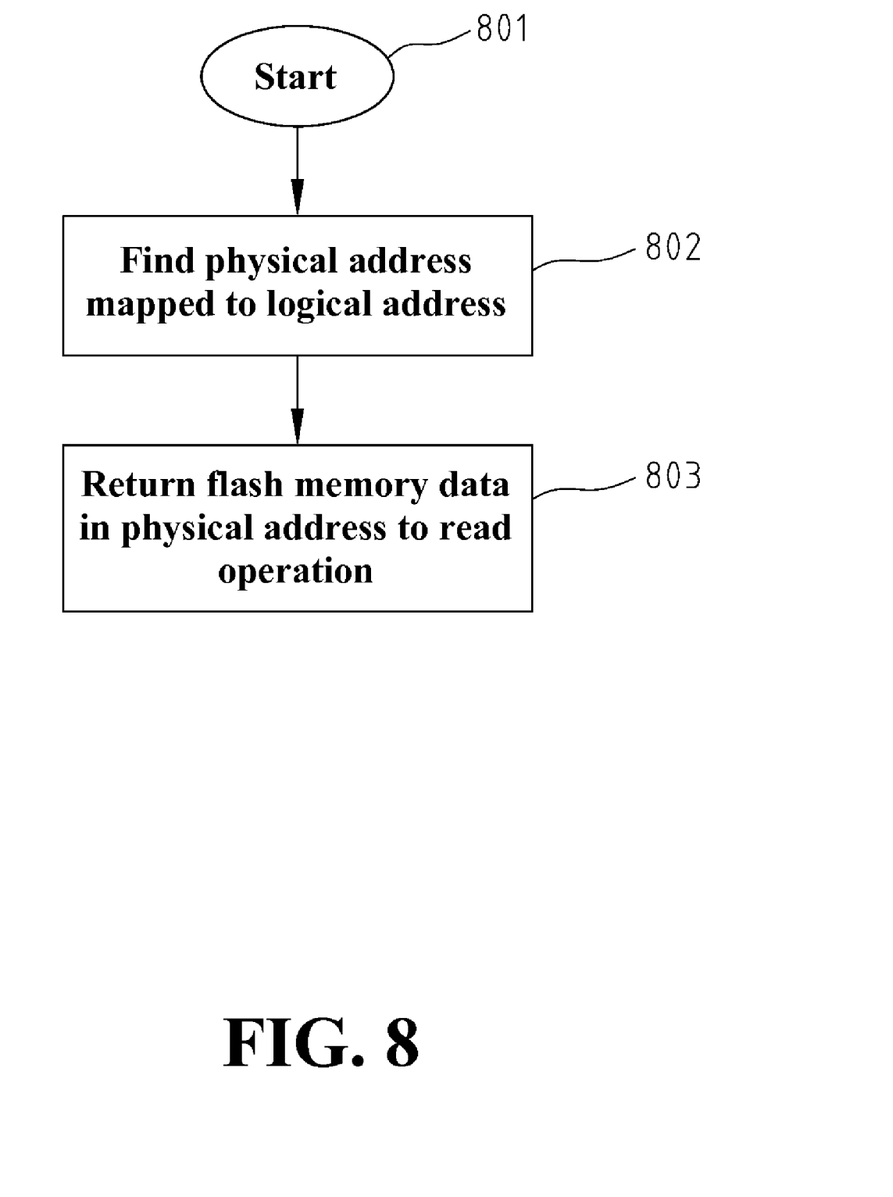
FIG. 8 shows a flowchart of the read process of FIG. 6.

FIG. 8 shows a flowchart of the read process of step 604 of FIG. 6. The read process starts with step 801. Step 802 is to find the physical address in the translation table corresponding to the logical address. Step 803 is to use the physical address to find the data in the flash memory and return the data to the read operation.

Figure 9:
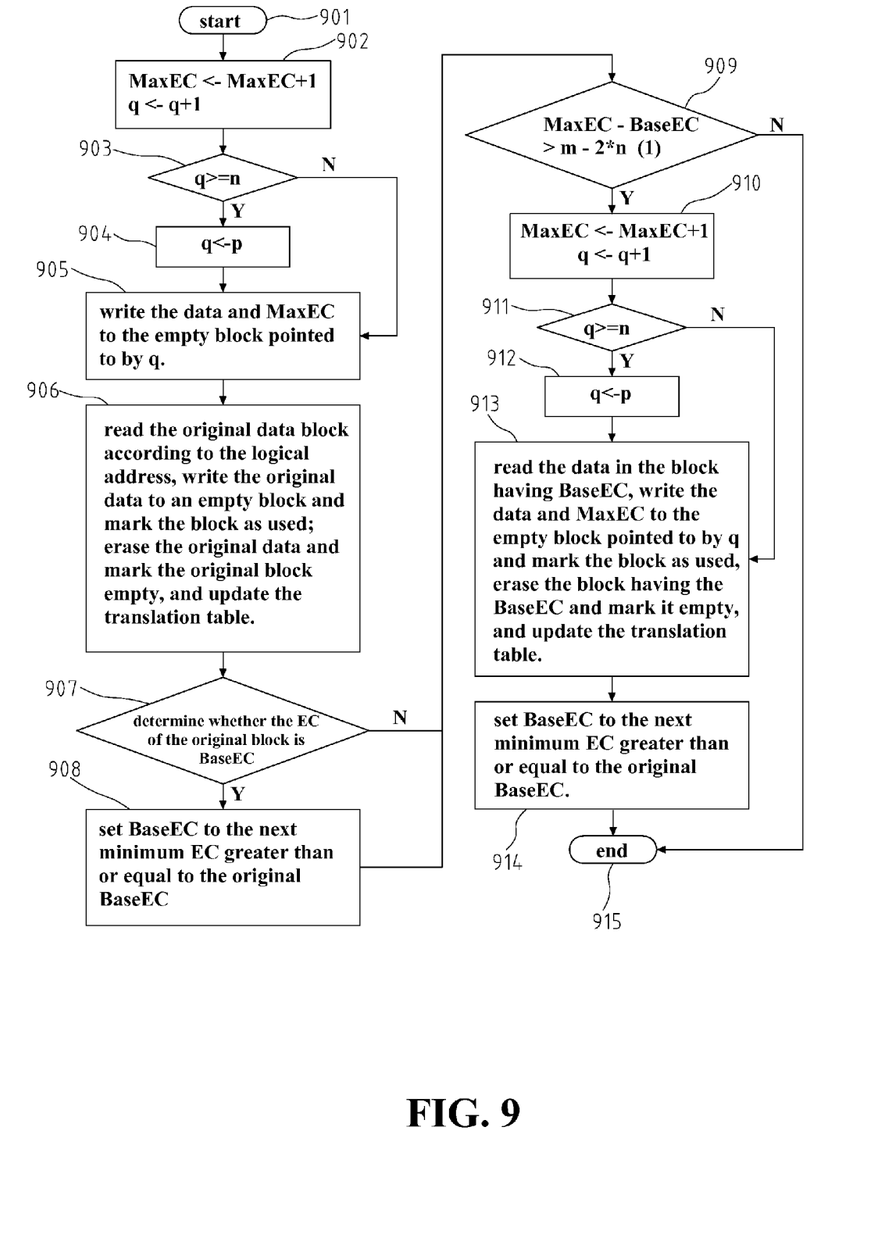
FIG. 9 shows a flowchart of the erase/program process of FIG. 6.

FIG. 9 shows a flowchart of the erase/program process of step 605 of FIG. 6. The erase/program process starts with step 901. Step 902 is to increment MaxEC and q, respectively. Step 903 is to determine whether q is greater than or equal to n; if so, proceed to step 904 to assign p to q and proceed to step 905; otherwise, proceed directly to step 905. Step 905 is to write the data and MaxEC to the empty block pointed to by q. Step 906 is to read the original data block according to the logical address, write the original data to an empty block and mark the block as used; erase the original data and mark the original block empty, and update the translation table. Step 907 is to determine whether the EC of the original block is BaseEC; if so, proceed to step 908 to set BaseEC to the next minimum EC greater than or equal to the original BaseEC; otherwise proceed to step 909.

Step 909 is to determine whether (MaxEC−BaseEC)>(m−2*n); if so, proceed to step 910; otherwise, proceed to step 915 to end the process. Step 910 is to increment MaxEC and q, respectively. Step 911 is to determine whether q is greater than or equal to n; if so, proceed to step 912 to assign p to q and proceed to step 913; otherwise, proceed directly to step 913. Step 913 is to read the data in the block having BaseEC, write the data and MaxEC to the empty block pointed to by q and mark the block as used, erase the block having the BaseEC and mark it empty, and update the translation table. Step 914 is to set BaseEC to the next minimum EC greater than or equal to the original BaseEC.

It is worth noticing that the subtraction in the condition test in step 909 ignores the carry bit. It simplifies the subtraction and the control code. Also, steps 907-914 are only executed once for every erase/program operation; therefore, the erase/program operation has high efficiency.

Figure 10A:
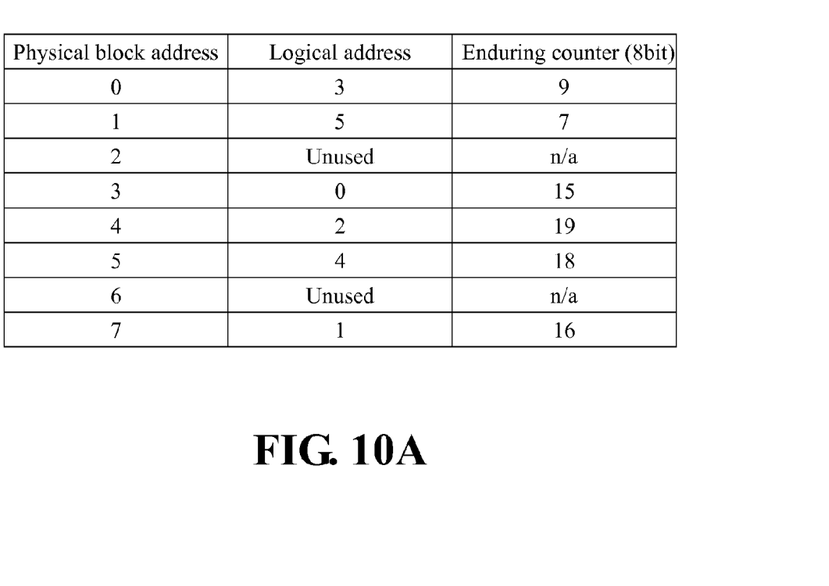
FIGS. 10A and 10B show a schematic view of an embodiment of translation table reconstruction using the reconstruction process of FIG. 7.
Figure 10B:
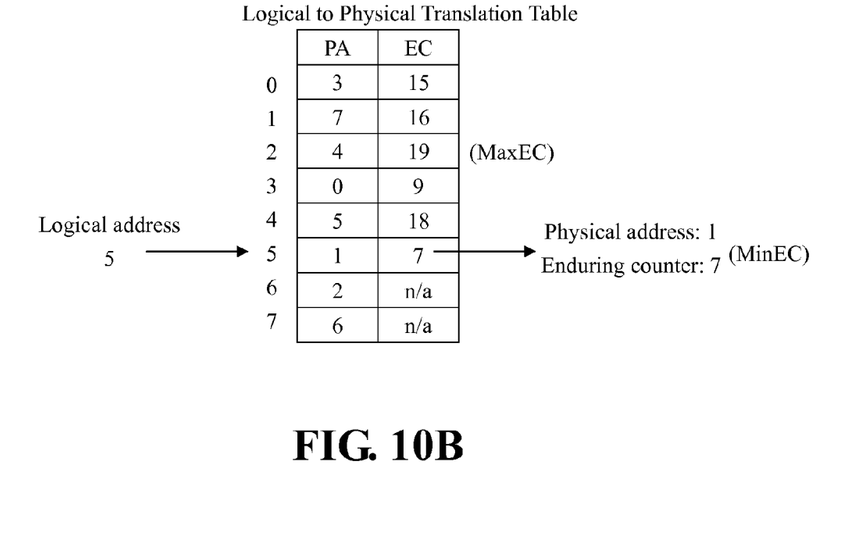

FIGS. 10A and 10B show a schematic view of an embodiment of translation table reconstruction using the reconstruction process of FIG. 7. FIG. 10A shows the data information in the spare region and FIG. 10B shows the translation table reconstructed using the spare region information on power up. This embodiment shows that the enduring counters of all the entries in the translation table are in a scenario that Boolean variable Reverse is false.

Figure 11A:
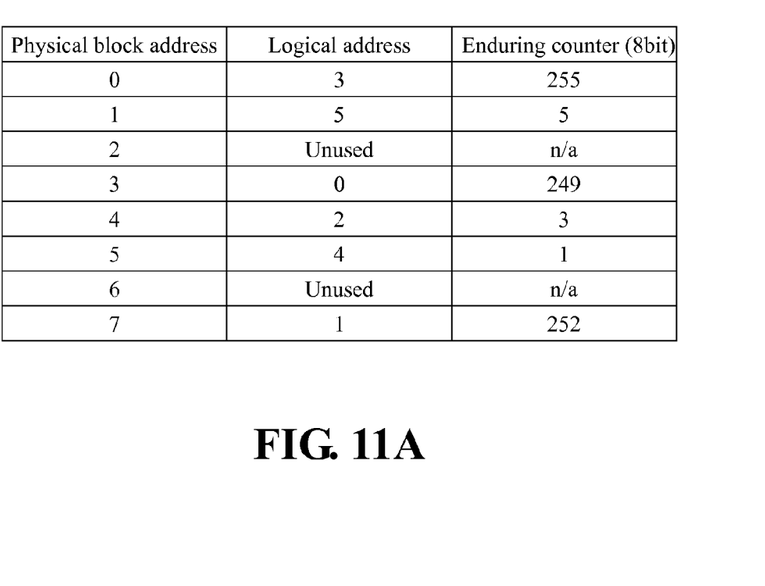
FIGS. 11A and 11B show a schematic view of another embodiment of translation table reconstruction using the reconstruction process of FIG. 7.
Figure 11B:
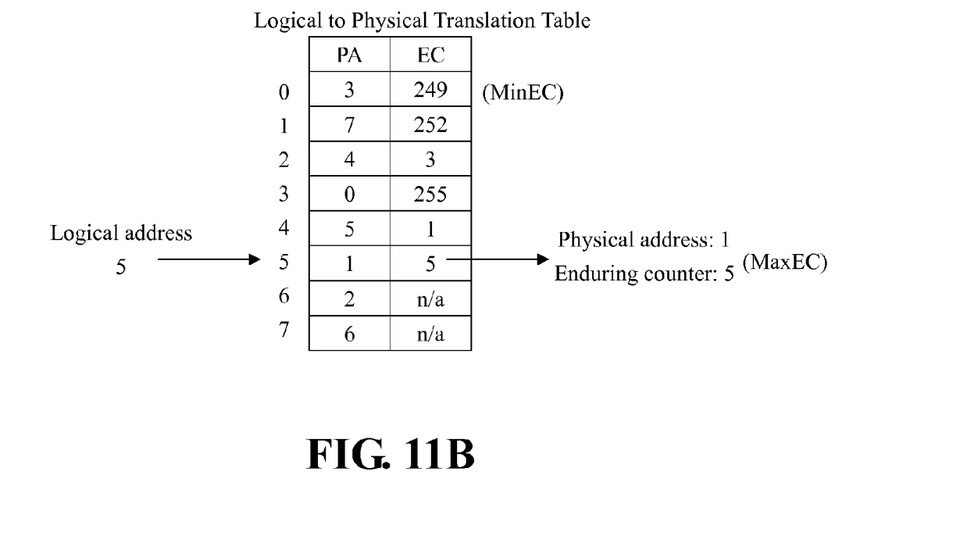

FIGS. 11A and 11B show a schematic view of another embodiment of translation table reconstruction using the reconstruction process of FIG. 7. As shown in FIG. 11B, the enduring counter shows the scenario when Boolean variable Reverse is true.

Figure 12A:
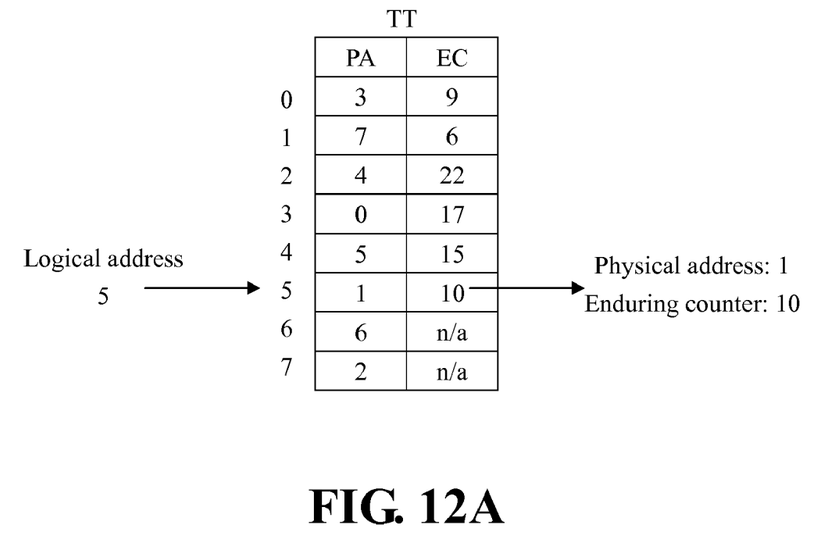
FIGS. 12A and 12B show a schematic view of the translation table before and after an erase/program operation according to the erase/program process of FIG. 9.
Figure 12B:
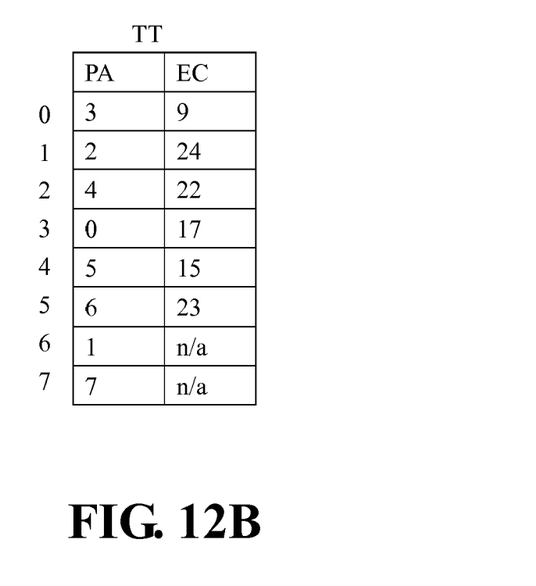

FIGS. 12A and 12B show a schematic view of the translation table before and after an erase/program operation according to the erase/program process of FIG. 9. Let m=32, n=8, p=6, q=7, x=8, BaseEC=6 (when logical address=1), MaxEC=22 (when logical address=2). Before the logical block 5 is written, the translation table is shown in FIG. 12A. After the erase/program operation, the translation is shown in FIG. 12B, and q=7, BaseEC=9, and MaxEC=24.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wear-leveling method for managing flash memory, said flash memory having a data region and a spare region, said spare region further storing a logical address and an enduring counter (EC) for a data block in said data region, said wear-leveling method using a translation table, and a wear-leveling algorithm comprising the following steps of:
    reconstructing said translation table when said flash memory is powered on;
    determining whether an operation is a read operation or an erase/program operation;
    proceeding to a read process if the operation is a read operation; otherwise, proceeding to an erase/program process if the operation is an erase/program operation; and
    waiting for a next operation and returning to said step of determining whether an operation is a read operation until no further operations;
    wherein variables n, p, q, m, x, BaseEC, MaxEC and Reverse are defined and used in said wear-leveling algorithm according to the following definition and rules:
    n being a number of data blocks in an access region;
    p being a logical address space, and n>p;
    q being a pointer pointing to an unused block;
    m being maximum difference in a number of erase/program operations between data blocks allowable within said access region;
    x being a number of bits in an enduring counter field in said translation table, and $2^x > 2 \times (m+n)$, $m > 2 \times n$;
    BaseEC being a minimum enduring counter value within said access region;
    MaxEC being a maximum enduring counter value within said access region; and
    Reverse being a Boolean variable indicating a condition of EC usage.

2. The method as claimed in claim 1, wherein said step of reconstructing said translation table further comprises the steps of:
    initializing BaseEC equal to EC value of a first block of said access region, MaxEC equal to EC value of a second block of said access region, and Reverse equal to false;
    determining whether BaseEC>MaxEC; if so, swapping BaseEC and MaxEC;
    repeating the following steps for all the remaining blocks of said access region until all the remaining blocks are processed:
        assigning EC of a block to BaseEC if Reverse is true, and said EC of the block meets the condition $EC>2^{(x-1)} \wedge BaseEC>EC$;
        assigning EC of the block to MaxEC if Reverse is true, and said EC of the block meets the condition $EC<2^{(x-1)} \wedge MaxEC<EC$;
        setting Reverse to true and assigning EC of the block to MaxEC if Reverse is false, BaseEC>EC, and (BaseEC−EC)>(m+n);
        assigning EC of the block to BaseEC if Reverse is false, BaseEC>EC, and (BaseEC−EC)<=(m+n);
        setting Reverse to true and assigning EC of the block to BaseEC if Reverse is false, EC>MaxEC, and (EC−MaxEC)>(m+n); and
        assigning EC of the block to MaxEC if Reverse is false, EC>MaxEC, and (EC−MaxEC)<=(m+n).

3. The method as claimed in claim 1, wherein said read process further comprises the following steps of: finding a physical address in said translation table corresponding to said logical address; using said physical address to find data in said flash memory; and returning said data to said read operation.

4. The method as claimed in claim 1, wherein said erase/program process further comprises the following steps of:
    incrementing MaxEC and q, respectively;
    determining whether q>=n; if so, assigning p to q;
    writing the data to be programmed and MaxEC to an empty block pointed to by q;
    reading original data not to be programmed in original data block according to said logical address, writing said original data to said empty block and marking the block as used; erasing said original data and marking said original data block empty, and updating said translation table;
    determining whether a value of the EC of said original data block is BaseEC; if so, setting BaseEC to a next minimum EC value in said access region which is greater than or equal to original BaseEC;
    determining whether (MaxEC−BaseEC)>(m−2*n); if not, ending said erase/program process;
    incrementing MaxEC and q, respectively;
    determining whether q>=n; if so, assigning p to q; reading data in the block having EC value equal to BaseEC, writing the data and MaxEC to an empty block pointed to by q and marking the block as used, erasing said block having EC value equal to BaseEC and marking the erased block as empty, and updating said translation table; and setting BaseEC to a next minimum EC value in said access region which is greater than or equal to original BaseEC.

* * * * *